United States Patent
Krassnitzer et al.

(10) Patent No.: US 11,629,398 B2
(45) Date of Patent: Apr. 18, 2023

(54) CATHODIC ARC IGNITION DEVICE

(71) Applicant: Oerlikon Surface Solutions AG, Pfäffikon, Pfäffikon (CH)

(72) Inventors: Siegfried Krassnitzer, Feldkirch (AT); Juerg Hagmann, Sax (CH); Andreas Peter Treuholz, Bad Ragaz (CH); Dominik Erwin Widmer, Vilters (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/347,997

(22) Filed: Jun. 15, 2021

(65) Prior Publication Data

US 2021/0317567 A1     Oct. 14, 2021

Related U.S. Application Data

(63) Continuation of application No. PCT/EP2019/086746, filed on Dec. 20, 2019.

(60) Provisional application No. 62/782,724, filed on Dec. 20, 2018.

(51) Int. Cl.
*H01J 37/32* (2006.01)
*C23C 14/32* (2006.01)

(52) U.S. Cl.
CPC ...... *C23C 14/325* (2013.01); *H01J 37/32055* (2013.01); *H01J 37/32064* (2013.01); *H01J 2237/332* (2013.01)

(58) Field of Classification Search
None
See application file for complete search history.

(56) References Cited

U.S. PATENT DOCUMENTS 6,031,239 A     2/2000  Shi et al.
6,319,369 B1 *  11/2001 Flynn ............... H01J 37/32697
                                                                427/580
(Continued)

FOREIGN PATENT DOCUMENTS

CN      101363114 A      2/2009
DE       19618073 C1 *   9/1997   ........ H01J 37/32055
(Continued)

OTHER PUBLICATIONS

International Search Report for PCT Application No. PCT/EP2019/086746 dated Apr. 9, 2020, 19 pages.
(Continued)

*Primary Examiner* — Jason Berman
(74) *Attorney, Agent, or Firm* — Michael J. Blessent; Bret E. Field; Bozicevic, Field & Francis LLP

(57) ABSTRACT

An arc ignition device for cathodic arc deposition of a target material onto a substrate, comprising a trigger finger arranged moveable between a contacting position and a resting position, wherein in the contacting position a side surface of an adjacent target can be physically contacted by the trigger finger, and in the resting position the adjacent target cannot be contacted by the trigger finger, wherein during cathodic arc deposition of a target material, the trigger finger is arranged movable between the contacting position and the resting position in such a way that the contamination of the trigger finger with deposited target material during the cathodic arc deposition of the target material can be minimized.

25 Claims, 4 Drawing Sheets

(56) References Cited

U.S. PATENT DOCUMENTS

| | | | |
|---|---|---|---|
| 6,413,387 B1 * | 7/2002 | Shi | H01J 37/32009 204/298.41 |
| 6,602,390 B1 | 8/2003 | Brändle et al. | |
| 2011/0220495 A1 | 9/2011 | Krassnitzer et al. | |

FOREIGN PATENT DOCUMENTS

| | | | | |
|---|---|---|---|---|
| EP | 3388547 A1 | 10/2018 | | |
| KR | 20110076815 A1 * | 7/2011 | | |
| WO | WO-2010054726 A1 * | 5/2010 | | C23F 1/08 |
| WO | WO2011080932 A1 | 7/2011 | | |

OTHER PUBLICATIONS

International Preliminary Report on Patentability for PCT Application No. PCT/EP2019/086746 dated Jun. 16, 2021, 11 pages.
Scheffel et al., Rod cathode arc-activated deposition (RAD)—a new plasma-activated electron beam PVD process, Surface and Coatings Technology, vols. 120-121, Nov. 1999, pp. 718-722.
Office Action for Indian Application No. 202127030361 dated Jan. 23, 2023, with its English translation, 6 pages.
Invitation to Respond to Written Opinion for Singaporean Application No. 11202106614U dated Dec. 26, 2022, along with a Written Opinion and Search Report, 11 pages.

\* cited by examiner

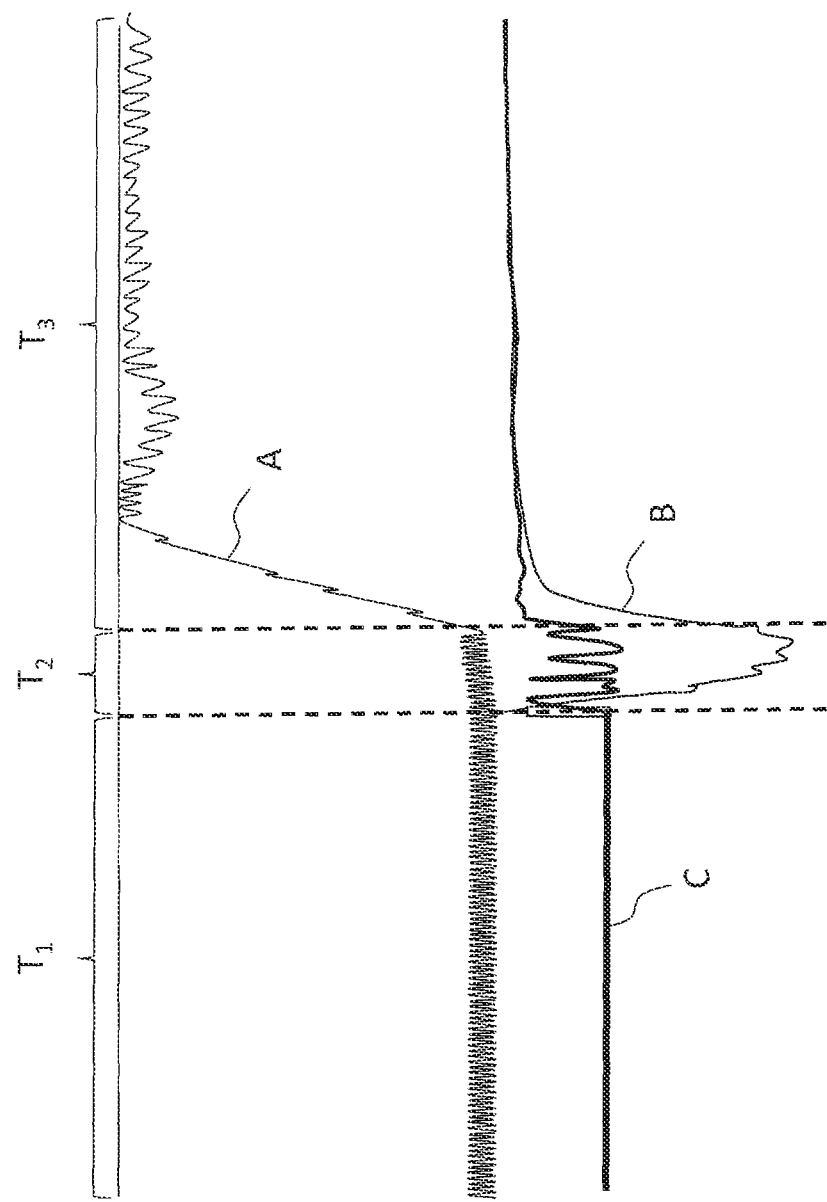

CATHODIC ARC IGNITION DEVICE

The present invention relates generally to an apparatus for physical vapor deposition, and more particularly, to an arc ignition device, an assembly and a method for cathodic arc deposition in a coating chamber.

STATE OF THE ART

Cathodic arc deposition is a known physical vapor deposition process. For the execution of a cathodic arc deposition process usually means are used for igniting a high-current discharge for producing evaporation of a target material placed in an arc evaporator (hereinafter also referred to as arc evaporation source, arc source or spark source), wherein the arc evaporator is placed in a vacuum chamber of a coating apparatus. An arc evaporator usually comprises a target material operable as cathode during an arc evaporation. The arc evaporator may also comprise at least one electrode operable as anode during arc evaporation. In cases in which the arc evaporator does not comprise any integrated anodes, also other electrodes placed within the vacuum chamber can be operated as anodes. It is also known that in some cases the walls of the vacuum chamber are operated as anode.

In order to start a cathodic arc deposition process it is necessary to ignite an electric arc at the surface of the target material to be evaporated while being operated as cathode.

During the arc deposition process substrates (e.g. workpieces such as components or tools) are treated under high vacuum, in particular for subjecting the substrates to plasma treatments such as plasma etching or coating (e.g. coating by means of an cathodic arc physical vapor deposition process).

Different kinds of ignition devices for arc evaporation sources are already known and are described, for example in the US application with Appl. No.: US 2011/0220495 A1. There it is explained that the kinds of ignition devices can essentially be divided into 3 groups: a) Devices for mechanical closing and opening of a contact between the cathode and the anode; b) Devices for ignition of the arc discharge through an electric sparkover; and c) Devices for ignition through an electrically conducting bridge.

Prior to coating deposition, in an arc deposition process substrates to be coated are placed in the coating chamber and the coating chamber is evacuated. As just mentioned above an electric arc is used to evaporate material from a surface of the target, hereby providing coating material for the coating deposition. The cathodic arc evaporation process begins by striking a high current, low voltage electric arc on the surface of the target serving as cathode, which results in an emission of electrons from the surface of the target (being operated as cathode) toward an anode.

As just mentioned above ignition of the electric arc can be achieved by using an ignition finger which has to be brought in contact with the target surface to be evaporated. Such an ignition finger is also commonly referred to as trigger finger. Conventionally during and sometimes even after ignition of the electric arc, the ignition finger is exposed to material evaporated from the target surface. This exposure results in the build-up of coating films (e.g., a metallic or a ceramic film such as a nitride film, or an oxide film, or another kind of film) on the ignition finger. Such build-up can degrade the ignition finger's ability to perform its function (e.g., to ensure electrical contact and subsequent ignition of the electric arc). As such, routine maintenance is required to remove such unwanted coatings. However, a frequent maintenance reduces operative time and consequently reduces overall efficiency of coating manufacturing processes. On the other hand, if maintenance is not carried out frequently enough, not only the ability of the ignition finger to carry out the first ignition, but also the speed and reliability with regard to any necessary re-excitation will be reduced. This results then likewise in reduced efficiency of the coating manufacturing process and may furthermore result in a reduced coating quality. In operation, the cathode spot is only active for a short period of time before it self-extinguishes and self-re-ignites in a new area close to the previous cathode spot. This behavior causes the apparent motion of the electric arc. When the cathode spot extinguishes completely and cannot self-re-ignite in a new area as mentioned above, the electric arc becomes extinguished (i.e., a black-out period is produced) during processing. In such a case, the ignition finger must be used again for re-excitation in order to ignite a new electric arc at the target surface. This re-ignition of a new electric arc by using conventional ignition devices with ignition fingers takes conventionally more than 50 ms. Sometimes, the entire process must be even shut down so that maintenance can be performed on the ignition finger, for example, in cases when the contact surface of the ignition finger is no longer suited to ensure electrical contact for initiating an electrical arc due to unwanted coating material on the ignition finger or when the ignition system needs maintenance for some other reasons. Thus, known triggering devices comprising known finger ignition systems (i.e. ignition systems for igniting an electric arc at the target surface in an arc cathodic evaporator) do not allow for a sufficiently fast retriggering of the trigger finger for attaining a fast re-ignition of the electric arc. Unfortunately, the known systems interrupt the arc evaporation process based on an undesired extinguishment of the electric arc during execution of the process (resulting in black-out periods of more than 50 ms).

OBJECTIVE OF THE PRESENT INVENTION

It is an object of the present invention to alleviate or to overcome one or more difficulties related to the prior art. In particular, it is an object of the present invention to provide an arc ignition device and an assembly for cathodic arc deposition to provide a simple and inexpensive arc initiation device and cathodic arc deposition assembly that provides fast, high quality, reliable and low maintenance cathodic arc deposition.

BRIEF DESCRIPTION OF THE PRESENT INVENTION

In order to overcome these problems an arc ignition device according to the present disclosure, an assembly for cathodic arc deposition according to the present disclosure and a method of sparking an arc for cathodic arc deposition according to the present disclosure have been invented. The present invention relates in particular to an ignition device (hereinafter also referred to as ignition apparatus) for igniting a high-current discharge of an arc evaporator in a vacuum coating system (a vacuum coating system is hereinafter also called vacuum coating apparatus).

The ignition apparatus provided by the present invention in particular allows reducing or eliminating the maintenance required due to the build-up of coating film on the ignition finger in an ignition apparatus. Further, the ignition apparatus according to the present invention makes possible a fast regeneration of an electric arc that is unintentionally extinguished, thus eliminating any black-out period. In this context, the term "fast regeneration of an electric arc" refers to a re-ignition of the electric arc within a period of time of 50 ms or lower, preferably between 20 ms and 50 ms. In a first aspect of the present invention disclosed is an arc ignition device for cathodic arc deposition of a target material onto a substrate, comprising a trigger finger arranged moveable between a contacting position and a resting position, wherein in the contacting position a side surface of an adjacent target can be physically contacted by the trigger finger, and in the resting position the adjacent target cannot be contacted by the trigger finger, wherein during cathodic arc deposition of a target material, the trigger finger is arranged movable between the contacting position and the resting position in such a way that the contamination of the trigger finger with deposited target material during the cathodic arc deposition of the target material can be minimized. In the context of the invention, a trigger finger is preferably understood to be an essentially elongated, in particular rod-shaped release unit. A minimization of contamination of the trigger finger in accordance with the invention is achieved in particular due to the specific arrangement of the trigger finger in accordance with the invention and due to the type and speed of movement of the trigger finger between the contacting position and the resting position.

The arc ignition device according to the invention can be placed within a vacuum chamber, in particular at a wall of a vacuum chamber, the vacuum chamber preferably having place for receiving one or more substrates to be coated. The vacuum chamber preferably can be evacuated to a predetermined pressure below atmospheric pressure (for example, less than 10 Pa—total pressure adjusted for accomplishing physical vapor deposition processes is usually in a range between 0.01 Pa and 8 Pa, however this range should not be understood as a limitation of the present invention—Vacuum quality pressure ranges are usually classified in vacuum types: Low: 760-0 Torr, Medium: $0$-$10^{-3}$ Torr, High: $10^{-3}$-$10^{-8}$ Torr, Ultra High: $10^{-8}$-$10^{-12}$ Torr, Extreme High: $<10^{-12}$, Outer Space: $\sim 10^{-16}$ Torr).

In an example of the first aspect, the arc ignition device comprises a housing in which it is at least partially located, wherein the housing can be disposed outside of an adjacently arrangeable vacuum chamber. The housing may be fluidly connected to the interior of a chamber, such that a vacuum exists within the housing or at least within a part of the housing. In particular, a housing can serve to protect against contamination and provide electrical insulation. In addition, the arc ignition device can be kept at the pressure level of a vacuum coating chamber in a simple and flexible way by means of a housing.

In another example of the first aspect the arc ignition device comprises an actuator for moving the trigger finger between the contacting position and the resting position, wherein the trigger finger can be moved between the contacting position and the resting position by the actuator in less than 50 ms, preferably in between 50 ms and 20 ms, more preferably in between 20 ms and 10 ms. Such a fast movement allows especially fast ignitions and re-ignitions of arcs. With a view to effectively avoiding contamination with deposition target material, the actuator may be designed such that the trigger finger can leave the contacting position after at most 200 µs, preferably after at most 150 µs, in particular after at most between 150 µs and 100 µs. The actuator further preferably may be provided for linearly moving the trigger finger in an axial direction of said trigger finger.

In another example of the first aspect, the actuator being an electromagnetic actuator. In such a case, the electromagnetic actuator can be provided such that an electromagnetic field can be generated for elongating a spring to a pre-determined extended (elongated) length, moving the trigger finger from the resting position to the contacting position. When the electromagnetic field is deactivated, the spring may return to its free length or pre-loaded length such that the trigger finger moves back to its resting position. To ensure adequate contact between the trigger finger and a side surface of the target, the inventors suggest generating a magnetic field that produces a spring elongation corresponding to a distance that is greater than the real distance traversed by the tip of the trigger finger when it is moved from its resting position to its contacting position. For example, if the real distance that the tip of the trigger finger must travel (between the resting position and the contacting position) is 3 mm, then a force should be provided that produces an expected spring elongation and corresponding elongation distance that is greater than 3 mm. This means that the force should be selected to provide for an elongation distance of, for example, 4 mm if no target is placed in the movement envelope of the tip of the trigger finger at the contacting position. In other words, the pre-determined extended (elongated) length mentioned above corresponds to a calculated or pre-determined spring elongation that would be the total distance traveled by a compression spring from its free length or pre-loaded length to its extended (elongated) length if a pre-selected force acts on the compression spring and no obstacles are disposed in between for preventing the elongation of the spring. That would be for example the case, if an electromagnetic field force acts on the compression spring and no obstacles are disposed in between.

In another example of the first aspect, the arc ignition device comprises a current limiting component to limit the current during a contacting step to a value of less than 5 A, preferably to a value between 2 A and 5 A. A current limiting device can be used here especially with regard to a material-saving ignition and re-ignition of an arc.

In another example of the first aspect, the arc ignition device comprises a rod having a first end and an opposing second end, wherein preferably the first end being positioned within the adjacently arrangeable chamber and the second end being positioned within the housing.

In another example of the first aspect, the arc ignition device further comprises a spring (e.g. an extension spring) that moves the trigger finger into the resting position. Moving the trigger finger may be accomplished preferably by relaxing the tensile stress of the spring that was generated when the spring was elongated and the trigger finger was in the contacting position. In particular, the use of a spring provides a simple design option for fast and precisely determinable movement of the trigger finger.

In another example of the first aspect, the trigger finger being at least partially comprised of tungsten. The trigger finger can also be made of an electrically conductive material different from tungsten but comprising a trigger tip made of tungsten or made of tungsten alloyed with other materials as mentioned below. Tungsten or tungsten allowed materials are used as trigger finger or as tip of the trigger finger for acting as contact material (non-consumable electrode) for channeling the current needed to create (to ignite) the electrical arc that will burn at the target surface. Since pure tungsten electrodes are cost effective, but their heat resistance is poor, different kinds of alloyed elements can be used to influence the performance of tungsten, for example cerium, lanthanum or thorium. Tungsten alloyed materials are known to be used in TIG welding processes and usually comprise the above-mentioned alloyed elements in a concentration not higher not higher than 2%. Such kind of tungsten alloyed materials can be used for the manufacture of trigger fingers according to the present invention.

In a second aspect of the present invention disclosed is an assembly for cathodic arc deposition of a material onto a substrate, the assembly comprising a previously described arc ignition device; a chamber for receiving a substrate to be coated, the chamber being evacuated to a predetermined pressure below atmospheric pressure; a cathode back support disposed within the chamber; a target located adjacent the cathode back support plate, the target having a first surface facing away from the cathode back support, a second surface spaced from the first surface and facing the cathode back support, and a side surface connecting the first and second surfaces, wherein a plasma material is to be ejected from the first surface.

In an example of the second aspect, the anode may be disposed within the chamber and spaced from the target. Equally well it is possible that the anode being spaced outward and away from the first surface of the target.

In another example of the second aspect, in the contacting position the trigger finger of the arc ignition device physically contacts the side surface of the target, and in the resting position the trigger finger does not contact the target.

In another example of the second aspect, in particular with regard to a reliable protection against contamination of the trigger finger by deposited target material, the assembly may further comprise a confinement member for protection of the trigger finger from being contaminated with deposited material. The confinement member may be positioned within the chamber and may have a groove formed on its surface. Preferably, in the contacting position a first end of the trigger finger physically contacts the target, and in the resting position the first end of the trigger finger does not contact the target and is located within the groove of the confinement member to inhibit exposure of the first end to the deposited material. The confinement member thereby may be located adjacent the side surface of the target and preferably may be positioned between the cathode back support and the anode. For example, the confinement member being ring shaped with a central opening defined by an inner side wall, wherein the groove extends from an outer side wall of the confinement member to the inner side wall, in a radial direction of the confinement member. Hereby, the central opening may have a diameter that is greater than a width of the target such that the confinement member is disposed about the target.

In a third aspect of the present invention disclosed is a method of sparking an arc for cathodic arc deposition of a material, in particular by using a previously described assembly, the method comprising the steps of: providing an anode and a target within an evacuated chamber; providing a trigger finger having a first end positioned within the chamber and a second end positioned outside the chamber; producing the movement of the trigger finger into a resting position wherein the first end of the trigger finger is housed within a confinement member such that the first end is hidden from a plasma material; translating the trigger finger from the resting position to a contacting position wherein the first end of the trigger finger is not positioned within the confinement member, and wherein the first end physically contacts a side surface of the target; and translating the trigger finger from the contacting position back to the resting position.

In an example of the third aspect, in particular with regard to a structurally simple possibility of ensuring a fast and exactly definable movement of the trigger finger, the step of producing the movement of the trigger finger into the resting position may be accomplished via a spring, wherein translating the trigger finger from the contacting position back to the resting position may be accomplished via a force of the spring for returning to its free length.

To adjust a positioning of the trigger finger as exactly as possible, the step of translating the trigger finger from the resting position to the contacting position may be accomplished via an actuator positioned outside the chamber.

In another example of the third aspect, in particular with regard to the possibility of fast ignitions and re-ignitions of arcs, the amount of time the trigger finger stays in the contacting position is less than 250 µs, preferably less than 200 µs, more preferably between 150 µs and 100 µs.24. With regard to a minimization of contamination of the trigger finger with deposited target material during the arc deposition, the amount of time it takes the trigger finger to move from the resting position to the contacting position may not exceed 50 ms, preferably may take a time between 20 ms and 50 ms, more preferably a time between 20 ms and 10 ms. Furthermore, for example, by adjusting the translation time to 20 ms, the triggering repetition (the retriggering) may correspond to a frequency of 50 Hz In a fourth aspect of the present invention, disclosed is the use of a previously described arc ignition device in a pulsed cathodic arc deposition process.

In a fifth aspect of the present invention disclosed is the use of a previously described assembly in a pulsed cathodic arc deposition process. The use of an arc ignition device according to the invention or an arrangement according to the invention for pulsed processes is particularly suitable due to the re-ignition which can be achieved practically as often and quickly as desired due to the low contamination of the trigger finger.

DETAILED DESCRIPTION

FIG. 4 is a diagram of an electrical behavior of one embodiment of the cathodic arc deposition assembly.

Figure 1:
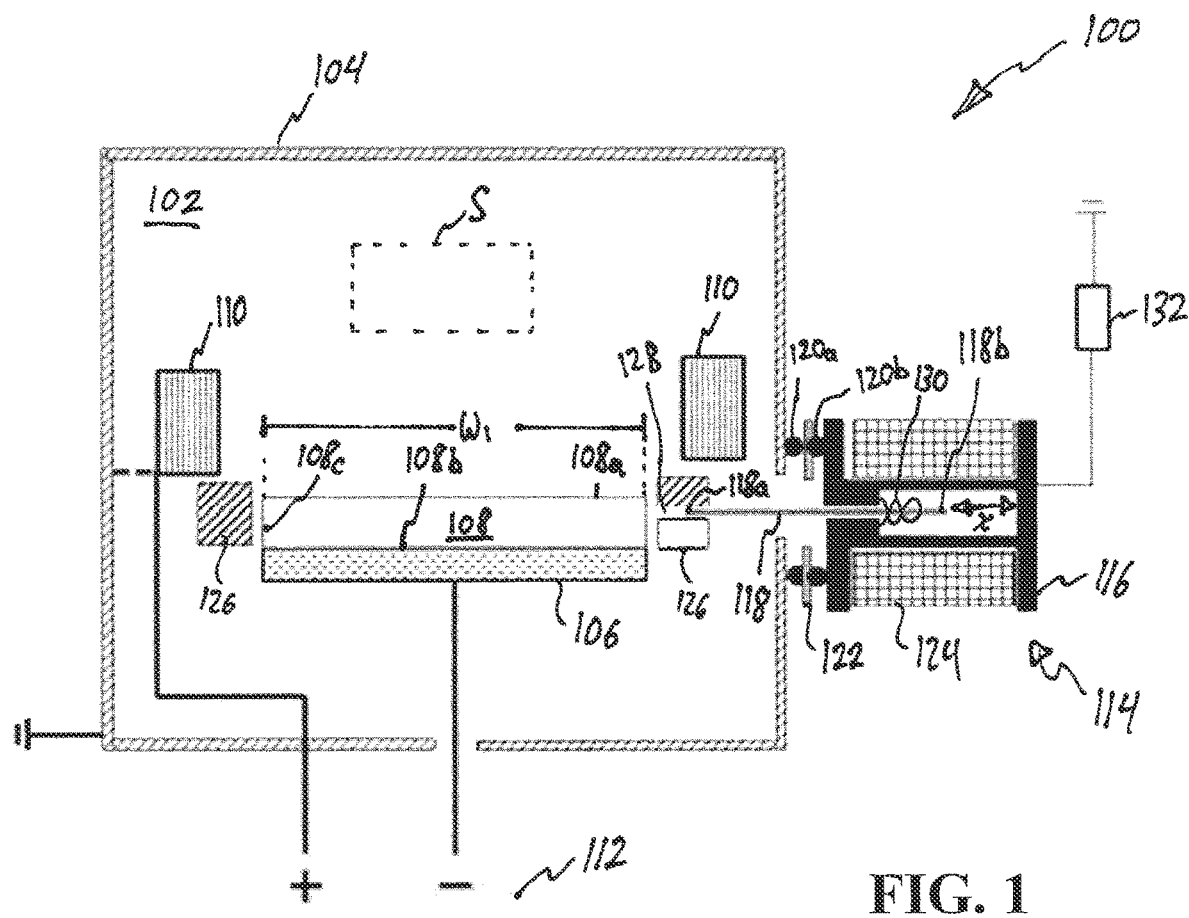
FIG. 1 is a schematic side-sectional view of an assembly for cathodic arc deposition having an arc ignition device, wherein a trigger finger of the arc ignition device is shown in a resting position.

Referring now to the drawings, FIG. 1 shows a cathodic arc deposition assembly 100 for depositing a coating (i.e., material) on one or more substrates S to be coated. The cathodic arc deposition assembly 100 includes a chamber 102 defined by an outer shell 104. At least during operation of the cathodic arc deposition assembly 100, the chamber 102 is provided in a vacuumed state. That is, the chamber 102 is evacuated to a predetermined pressure that is below atmospheric pressure (e.g., less than 10 Pa—total pressure adjusted for accomplishing physical vapor deposition processes is usually in a range between 0.01 Pa and 8 Pa, however this range should not be understood as a limitation of the present invention—Vacuum quality pressure ranges are usually classified in vacuum types: Low: 760-0 Torr, Medium: 0-10⁻³ Torr, High: $10^{-3}$-$10^{-8}$ Torr, Ultra High: $10^{-8}$-$10^{-12}$ Torr, Extreme High: <$10^{-12}$, Outer Space: ~$10^{-16}$ Torr). This is accomplished by a vacuum pump (not shown) provided in fluid communication with the chamber 102.

As further shown, a cathode back support 106 is disposed within the chamber 102. A target 108 (i.e., cathode) is located adjacent the cathode back support 106 and includes a first surface 108a, a second surface 108b spaced from the first surface 108a, and a side surface 108c that connects the first and second surfaces 108a, 108b. The target 108 is positioned such that the second surface 108b faces the cathode back support 106 and the first surface 108a faces away from the cathode back support 106. Specifically, the second surface 108b of the target 108 physically contacts the cathode back support 106 such that the target 108 rests thereon.

An anode 110 is positioned within the chamber 102 at a spaced location from the target 108. Specifically, the anode 110 is spaced outward and away from the first surface 108a of the target 108 such that the anode 110 is disposed vertically above the target 108. It is to be understood that the disclosures herein are made with respect to a schematic depiction of a cathodic arc deposition assembly and that said disclosures are not limited thereto. For example, while the schematic depiction in FIG. 1 and its accompanying disclosures herein are made with respect to a vertical orientation (i.e., the target 108 located on top of the cathode back plate 106 and the anode 110 spaced vertically above the target 108) it is contemplated that other orientations (e.g., horizontal) are possible.

Target material (not shown) is to be evaporated from the first surface 108a of the target 108, wherein a plasma is formed from the evaporated material, from which material is deposited onto the substrate S to be coated forming a coating. This is accomplished by providing a power supply 112 which generates and maintains an electric arc of the cathodic arc deposition assembly 100. Specifically, a positive terminal of the power supply 112 is operatively connected to the anode 110 and a negative terminal of the power supply 112 is operatively connected through the cathode back support 106 to the target 108. The power supply 112 supplies an idle voltage within the range of 40V-200V.

To generate the electric arc, the target 108 is struck by a striking means (i.e., a trigger finger, to be discussed further below); doing so creates a closed electrical circuit from the power supply 112 through the target 108 and through the striking means. When the striking means disengages the target 108, the electrical circuit path between the striking means and target 108 is broken, causing an electric arc to jump the gap between the striking means and the target 108, thereby initiating an electric arc on the target 108. Upon initiation of the electric arc, the arc path immediately extends between the target 108 and the anode 110 and is thereafter maintained by the power supply 112.

Due to the high electrical current levels passing through the target 108 during operation, the target 108 may become extremely hot. As such, the cathodic arc deposition assembly 100 may include cooling means (not shown) configured to cool the target 108. This cooling means may be formed integral with the cathode back support 106 or may be a separate and distinct feature.

As further shown in FIG. 1, the cathodic arc deposition assembly 100 includes an arc ignition device 114 configured to generate the electric arc. The arc ignition device 114 includes a housing 116 disposed outside the chamber 102, and a trigger finger 118 provided for linear movement in an axial direction X of the trigger finger 118. The housing 116 is attached to the outer shell 104 of the chamber 102 at a location of an aperture formed therein. Specifically, a seal is disposed between the outer shell 104 and the housing 116 in order to sealingly engage the former to the latter. The seal comprises first and second seal rings 120a, 120b that physically contact the outer shell 104 and the housing 116, respectively. As further shown, an electrical insulator 122 is disposed between the first and second seal rings 120a, 120b and is provided to electrically insulate the chamber 102 and the arc ignition device 114.

While other actuators can be employed (e.g., other forms of electromechanical actuators), an electromagnetic actuator is preferred because it enables the trigger finger to move while the moving parts of the actuator are in a vacuum (sealed and attached to the arc evaporation source), and the stimulating electrical coil is in atmosphere. Accordingly, the construction of arc ignition devices with very small designs is possible.

The arc ignition device 114 further includes an actuator 124 disposed within the housing 116. The actuator 124 moves (i.e., translates) the trigger finger 118 between a resting position and a contacting position, as will be explained below. Further, the actuator 124 may be a mechanical actuator but is preferably an electromagnetic actuator (e.g., a linear servo motor, solenoid, etc.). Specifically, the actuator 124 may be in the form of an electromagnetic actuator, wherein the electromagnetic actuator produces a mechanical movement after electrical stimulation of a coil. The electrical stimulation of the coil can be produced by a discharge of a capacitor (not shown). The actuator 124 may be activated in pulse form, giving the arc ignition device 114 a defined impulse movement wherein a repetition frequency of up to 50 Hz is achieved.

Figure 2A:
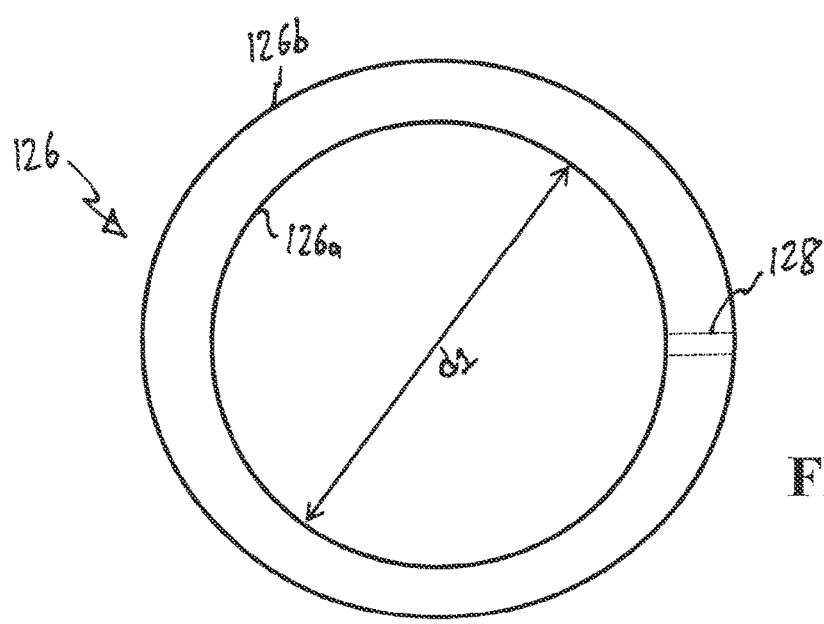
FIG. 2A is a schematic top view of a confinement member shown in FIG. 1.
Figure 2B:
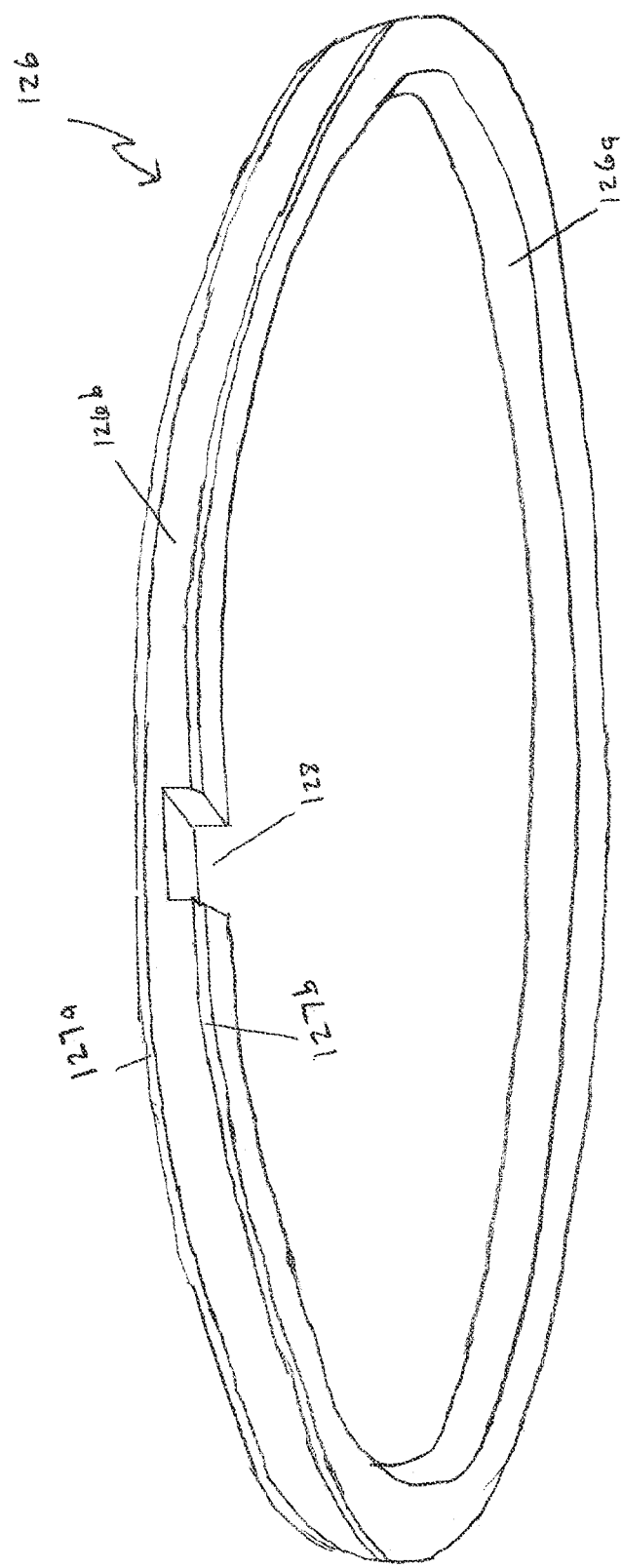
FIG. 2B is a schematic isometric view of the confinement member shown in FIG. 1.

The cathodic arc deposition assembly 100 further includes a confinement member 126 positioned within the chamber 102. As shown in FIGS. 2A and 2B, the confinement member 126 is preferably ring-shaped. However, other configurations are also contemplated. For instance, the confinement member 126 can be square-shaped or rectangular-shaped.

As shown in FIG. 2B, an outer peripheral surface of the confinement member 126 can be finished to include upper and lower chamfered edges 127a and 127b. In another example, the outer peripheral surface of the confinement member 126 can be finished to include rounded corners (e.g., radius corners). Alternatively, the outer peripheral surface can be unfinished (e.g., a 90° square corners).

Referring to FIGS. 2A and 2B, the confinement member 126 comprises a notch or a groove 128. The groove 128 is formed within the confinement member 126 and is configured to permit the trigger finger 118 to extend therethrough. Specifically, the confinement member 126 is located adjacent (preferably surrounding but without directly contacting) the side surface 108c of the target 108 and is positioned between the cathode back support 106 and the anode 110 in the vertical direction. The lateral distance between the confinement member and the target is preferably not larger than 1.5 mm (considering the radially distance). That is, the confinement member 126 is positioned above the cathode back support 106, and beneath the anode 110. The confinement member 126 is generally composed of steel (magnetic or unmagnetic).

With respect to FIGS. 2A and 2B, a schematic top view (FIG. 2A) of the confinement member 126 as well as a schematic isometric view (FIG. 2B) is shown. The confinement member 126 is ring shaped having an inner side wall 126a and an outer side wall 126b. The outer side wall 126b of the confinement member can be formed to define a concave, circumferential channel. However, the outer side wall 126b can be finished to have a convex-shaped projection extending along a circumference of the outer side wall 126b. Alternatively, the outer side wall 126b can include no circumferential channel. In another aspect, the outer side wall 126b can be formed to include an outwardly extending ridge or flange extending along a circumferential surface (e.g., retaining member) of the confinement member 126.

The groove 128 of the confinement member 126 extends from the inner side wall 126a to the outer side wall 126b in a radial direction of the confinement member 126. The confinement member must be designed having a groove 128 with dimensions that provide for a non-blocking passage of the trigger finger as it moves therein. At the same time the groove must be as narrow as possible for preventing plasma to burn therein, in particular to avoid depositing coating material on the internal surfaces of the groove. This means, for example, that if a trigger rod having a diameter of 2 mm is used, then the axial dimension of the groove 128 can be 3 mm as it is schematically shown in FIG. 2b. Further, the inner side wall 126a defines a central opening in the confinement member 126 having a diameter $d_1$. The diameter $d_1$ of the central opening is greater than a width $W_1$ of the target 108 such that the confinement member 126 is disposed about the target 108. In other words, the confinement member 126 circumferentially surrounds the target 108, wherein the inner side wall 126a of the confinement member 126 faces the side surface 108c of the target 108.

Moving back to FIG. 1, the trigger finger 118 is a rod having a first end 118a and an opposing second end 118b. The trigger finger 118, in particular the first end of the trigger finger (also referred as the tip of the trigger finger) may be composed of tungsten; alternatively, the trigger finger 118 may be composed of other materials as already described above. The trigger finger extends into the groove 128 of the confinement member 126 and is arranged to strike the side surface 108c of the target 108. As shown, the second end 118b of the trigger finger is disposed within the housing 116 of the arc ignition device 114.

As shown in FIG. 1, the trigger finger 118 is depicted in the resting position. Specifically, the first end 118a of the trigger finger 118 is located within the groove 128 of the confinement member 126. In this manner, the confinement member 126 inhibits exposure of the first end 118a of the trigger finger 118 to any plasma material (e.g., from ignition of the electric arc) disposed within the chamber 102. As further shown, a spring 130 is provided within the housing 116 and is configured to produce a movement of the trigger finger 118 into the resting position. The spring 130 is shown as a helical compression spring; it is further contemplated that other types of springs (e.g., extension springs, conical springs, disc springs, etc.) and spring orientations can be used to produce the movement of the trigger finger 118 into the resting position.

Figure 3:
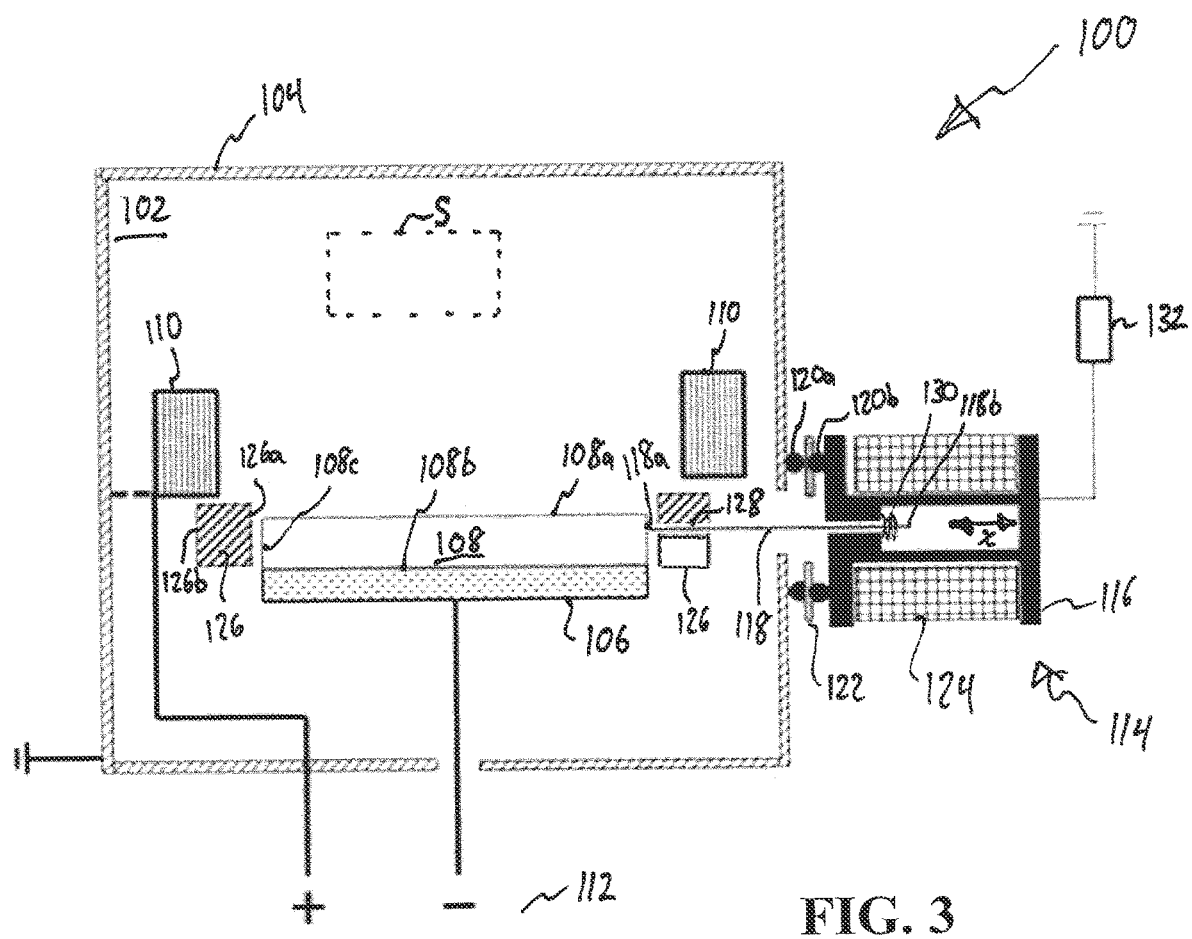
FIG. 3 is a schematic side-sectional view of the assembly of FIG. 1, wherein the trigger finger is shown in a contacting position.

Moving on to FIG. 3, the trigger finger 118 is shown in the contacting position. Specifically, as discussed above, the actuator 124 linearly translates the trigger finger 118 from the resting position (i.e., the first end 118a of the trigger finger 118 being located within the groove 128) to the contacting position wherein the first end 118a of the trigger finger 118 physically contacts the side surface 108c of the target 108. That is, the trigger finger 118 is moveable (e.g., in a direction perpendicular to an imaginary plane on which the side surface 108c sits) to strike (i.e., contact) the side surface 108c of the target 108. This orientation and arrangement provides a small trigger finger movement as opposed to striking the first or second surfaces 108a, 108b of the target 108. The total distance that the trigger finger 118 travels between the resting and contacting positions can be for example 3 mm, however this distance should not be understood as a limitation of the present invention. The shorter the distance that must be covered by the trigger finger during its movement from the resting position to the contacting position and vice versa, the shorter the time consumed by retriggering. Likewise, the effectivity can be higher and the complexity of the system can be reduced if shorter distances for the movement of the trigger finger are selected. Further advantages involved by using a trigger device (arc ignition device) according to the present invention are, for example, the following: a) no erosion of the side surface 108c is produced and therefore using the invention, a stable trigger geometry is ensured; b) no or considerably reduced deposition of coating film on the trigger finger (referring to the first end of the trigger finger or tip of the trigger finger) because the movement of the trigger finger to the resting position generally conceals the trigger finger within the housing of the ignition device or within the groove of the confinement member; c) compact design comprising actuator and parts for triggering function including electrical isolation and vacuum sealing.

When the trigger finger 118 is in the contacting position, a closed electrical circuit is created from the power supply 112 through the target 108 and through the arc ignition device 114 (i.e., via the trigger finger 118). As shown, the cathodic arc deposition assembly 100 further includes a resistor 132 that is electrically connected to the trigger finger 118. The resistor 132 limits the current to no more than 5 A, preferable in a range between 2 A-5 A, during the contacting position.

The operation of the cathodic arc deposition assembly 100 will now be described. Initially, the power supply 112 is activated, thereby delivering an idle voltage of 40V-200V. At this time, the trigger finger 118 is moved to the resting position via the spring 130. To generate the electric arc, the actuator 124 is activated (e.g., stimulating the coil via discharging a capacitor) such that the actuator 124 provides a force on the trigger finger 118 great enough to overcome the own force of the spring 130 for remaining in its free length or pre-loaded length (also referred to as relaxation length or relaxation position of the spring). In doing so, the trigger finger 118 linearly translates from the resting position to the contacting position, wherein the first end 118a of the trigger finger 118 physically contacts the side surface 108c of the target 108.

Of note, the amount of time it takes for the trigger finger 118 to move from the resting position to the contacting position does not exceed 50 ms, and is preferably between 10 ms-50 ms. When the first end 118a of the trigger finger 118 strikes the side surface 108c of the target 108, a closed electrical circuit is formed wherein a current of 2 A-5 A is delivered. Thereafter, the actuator 124 is deactivated; thus no longer providing the force to the trigger finger 118. As such, the trigger finger 118 translates back to the resting position under the own force of the spring 130 for returning to its free length. The amount of time that the trigger finger 118 remains in the contacting position (i.e., the first end 118a of the trigger finger 118 being in contact with the side surface 108c of the target 108) is no more than 100 µs and preferably less than 50 µs.

When this electrical circuit is broken, an electric arc (i.e., plasma material) is discharged from the target 108. This plasma material is then guided to the substrate (e.g., via magnetism) in order to coat the substrate S. In this manner, because the trigger finger 118 immediately reverts to the resting position (i.e., due to the own force of the spring 130 for producing its own relaxation) after deactivation of the actuator 124, and because the first end 118a of the trigger finger 118 is disposed within the groove 128 of the confinement member 126 in the resting position, the trigger finger 118 is hidden from the plasma material. In other words, the trigger finger 118 is always in the resting position (i.e., hidden from the plasma material) unless the actuator 124 is activated. As such, the trigger finger 118 is not exposed to the plasma material, thus a build-up of film on the trigger finger 118 will not occur.

With respect to FIG. 4, a diagram of the electrical behavior of one embodiment of the cathodic arc deposition assembly 100 is shown. The diagram is separated into a first time interval $T_1$, a second time interval $T_2$, and a third time interval $T_3$. The first-time interval $T_1$ represents the cathodic arc deposition assembly 100 after the power supply 112 has been activated, but before generation of an electric arc. That is, at the first time interval $T_1$, the trigger finger 118 is in the resting position. The second time interval $T_2$ represents the trigger finger 118 in the contacting position (i.e., as shown in FIG. 3). Specifically, the second time interval $T_2$ occurs over a period of 50 μs. That is, the amount of time that the first end 118a of the trigger finger 118 contacts the side surface 108c of the target 108 is equal to or less than 50 μs. The third time interval $T_3$ represents the generation of the electric arc, which occurs when the first end 118a of the trigger finger 118 disengages from the side surface 108c of the target 108. That is, the trigger finger 118 is again in the resting position during the third time interval $T_3$.

As shown, three lines (i.e., lines "A," "B," and "C") are disposed on the diagram and represent the electrical behavior of the cathodic arc deposition assembly 100 during each time interval (i.e., $T_1$-$T_3$). A first line "A" represents an electrical arc discharge current (i.e., in amperes). Line "A" remains substantially constant during the first and second time intervals $T_1$-$T_2$, wherein the electrical arc discharge current is equal to 0 A. However, during the third time interval $T_3$, the electrical arc discharge current rises to 200 A.

A second line "B" represents an amount of current (in amperes) at the trigger finger 118. As shown, the trigger finger 118 experiences no current (i.e., 0 A) during the first time interval $T_1$. During the second time interval $T_2$, the trigger finger 118 experiences a current of 3 A. The trigger current (i.e., line "B") is substantially reduced during the third time interval $T_3$, but does not become zero (i.e., 0 A).

Lastly, a third line "C" represents a voltage (i.e., in volts) of the cathodic arc deposition assembly 100. During the first time interval $T_1$, the voltage remains relatively constant, and is roughly equal to 140V. This voltage is supplied by the power supply 112. After generation of the electric arc (i.e., after the second time interval $T_2$), the voltage is reduced to a range of 20V-40V.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

The invention claimed is:

1. An arc ignition device for cathodic arc deposition of a target material onto a substrate, the arc ignition device comprising:

a trigger finger arranged moveable between a contacting position and a resting position, wherein in the contacting position a side surface of an adjacent target can be physically contacted by the trigger finger, and in the resting position the adjacent target cannot be contacted by the trigger finger, wherein during cathodic arc deposition of a target material, the trigger finger is arranged movable between the contacting position and the resting position in such a way that the contamination of the trigger finger with deposited target material during the cathodic arc deposition of the target material can be minimized; and an actuator for moving the trigger finger between the contacting position and the resting position, wherein the actuator is an electromagnetic actuator, wherein the electromagnetic actuator produces a mechanical movement after electrical stimulation of a coil, allowing moving the trigger finger between the contacting position and the resting position by the actuator in a time between 20 ms and 10 ms.

2. The arc ignition device according to claim 1, wherein the arc ignition device comprises a housing in which it is at least partially located, wherein the housing is disposed outside of an adjacently arrangeable vacuum chamber.

3. The arc ignition device according to claim 1, wherein the actuator is designed such that the trigger finger can leave the contacting position after at most 200 μs.

4. The arc ignition device according to claim 1, wherein the arc ignition device comprises a current limiting component to limit the current during a contacting step to a value of less than 5 A.

5. The arc ignition device according to claim 1, wherein the arc ignition device comprises a rod having a first end and an opposing second end.

6. The arc ignition device according to claim 1, wherein the actuator is provided for linearly moving the trigger finger in an axial direction of said trigger finger.

7. The arc ignition device according to claim 1, wherein the arc ignition device further comprises a spring that moves the trigger finger into the resting position.

8. The arc ignition device according to claim 1, wherein the actuator being an electromagnetic actuator.

9. The arc ignition device according to claim 1, wherein the trigger finger being at least partially comprised of tungsten.

10. An assembly for cathodic arc deposition of a material onto a substrate, the assembly comprising:

an arc ignition device according to claim 1, a chamber for receiving a substrate to be coated, the chamber being evacuated to a predetermined pressure below atmospheric pressure;

a cathode back support disposed within the chamber;

a target located adjacent the cathode back support plate, the target having a first surface facing away from the cathode back support, a second surface spaced from the first surface and facing the cathode back support, and a side surface connecting the first and second surfaces, wherein a plasma material is to be ejected from the first surface; and an anode disposed within the chamber and spaced from the target, wherein in the contacting position the trigger finger of the arc ignition device physically contacts the side surface of the target, and wherein in the resting position the trigger finger does not contact the target.

11. The assembly of claim 10, wherein the anode being spaced outward and away from the first surface of the target.

12. An assembly for cathodic arc deposition of a material onto a substrate according to claim 10, wherein the assembly further comprises a confinement member for protection of the trigger finger from being contaminated with deposited material.

13. An assembly for cathodic arc deposition of a material onto a substrate according to claim 12, wherein the confinement member is positioned within the chamber and has a groove formed therein.

14. An assembly for cathodic arc deposition of a material onto a substrate according to claim 12, wherein in the contacting position a first end of the trigger finger physically contacts the target, and wherein in the resting position the first end of the trigger finger does not contact the target and is located within the groove of the confinement member to inhibit exposure of the first end to the deposited material.

15. The assembly according to claim 10, wherein the confinement member is located adjacent the side surface of the target.

16. The assembly according to claim 10, wherein the confinement member being ring shaped with a central opening defined by an inner side wall, wherein the groove extends from an outer side wall of the confinement member to the inner side wall, in a radial direction of the confinement member.

17. The assembly according to claim 16, wherein the central opening has a diameter that is greater than a width of the target such that the confinement member is disposed about the target.

18. The assembly according to claim 10, wherein the arc ignition device comprises a housing disposed outside of the chamber.

19. A method of sparking an arc for cathodic arc deposition of a material, the method comprising the steps of:
providing an anode and a target within an evacuated chamber;
providing a trigger finger having a first end positioned within the chamber and a second end positioned outside the chamber;
providing an actuator for moving the trigger finger between a contacting position and a resting position, wherein the actuator is an electromagnetic actuator, wherein the electromechanical actuator produces a mechanical movement after electrical stimulation of a coil,
producing the movement of the trigger finger into a resting position wherein the first end of the trigger finger is housed within a confinement member such that the first end is hidden from a plasma material;
translating the trigger finger from the resting position to a contacting position wherein the first end of the trigger finger is not positioned within the confinement member, and wherein the first end physically contacts a side surface of the target; and
translating the trigger finger from the contacting position back to the resting position in a time between 20 ms and 10 ms by electrically stimulating the coil.

20. The method of claim 19, wherein the step of producing the movement of the trigger finger into the resting position is accomplished via a spring.

21. The method of claim 20, wherein the actuator is positioned outside the chamber.

22. The method according to claim 19, wherein the amount of time the trigger finger stays in the contacting position is less than 250 µs.

23. The method according to claim 19, wherein the amount of time it takes the trigger finger to move from the resting position to the contacting position does not exceed 50 ms.

24. Use of an arc ignition device for cathodic arc deposition of a target material onto a substrate, the arc ignition device comprising:
a trigger finger arranged moveable between a contacting position and a resting position, wherein in the contacting position a side surface of an adjacent target can be physically contacted by the trigger finger, and in the resting position the adjacent target cannot be contacted by the trigger finger, wherein during cathodic arc deposition of a target material, the trigger finger is arranged movable between the contacting position and the resting position in such a way that the contamination of the trigger finger with deposited target material during the cathodic arc deposition of the target material can be minimized in a pulsed cathodic arc deposition process; and
an actuator for moving the trigger finger between the contacting position and the resting position, wherein the actuator is an electromagnetic actuator, wherein the electromagnetic actuator produces a mechanical movement after electrical stimulation of a coil, allowing moving the trigger finger between the contacting position and the resting position by the actuator in a time between 20 ms and 10 ms.

25. Use of an assembly for cathodic arc deposition of a material onto a substrate, the assembly comprising:
an arc ignition device according to claim 1,
a chamber for receiving a substrate to be coated, the chamber being evacuated to a predetermined pressure below atmospheric pressure;
a cathode back support disposed within the chamber;
a target located adjacent the cathode back support plate, the target having a first surface facing away from the cathode back support, a second surface spaced from the first surface and facing the cathode back support, and a side surface connecting the first and second surfaces, wherein a plasma material is to be ejected from the first surface; and
an anode disposed within the chamber and spaced from the target,
wherein in the contacting position the trigger finger of the arc ignition device physically contacts the side surface of the target, and wherein in the resting position the trigger finger does not contact the target, in pulsed cathodic arc deposition process.

* * * * *